United States Patent [19]
Campardo et al.

[11] Patent Number: 5,886,925
[45] Date of Patent: Mar. 23, 1999

[54] READ CIRCUIT AND METHOD FOR NONVOLATILE MEMORY CELLS WITH AN EQUALIZING STRUCTURE

[75] Inventors: Giovanni Campardo, Bergamo; Rino Micheloni, Turate; Marco Maccarrone, Palestro, all of Italy

[73] Assignee: SGS-Thomson Microelectronics, S.r.l., Agrate Brianza, Italy

[21] Appl. No.: 877,922

[22] Filed: Jun. 18, 1997

[51] Int. Cl.[6] .................................................. G11C 16/06
[52] U.S. Cl. .................................. 365/185.21; 365/185.2
[58] Field of Search .............................. 365/210, 189.01, 365/189.09, 185.2, 185.21

[56] References Cited

U.S. PATENT DOCUMENTS

| | | | |
|---|---|---|---|
| 4,725,984 | 2/1988 | Ip et al. | 365/189 |
| 5,289,412 | 2/1994 | Frary et al. | 365/185 |
| 5,541,880 | 7/1996 | Campardo | 365/189.09 |
| 5,563,826 | 10/1996 | Paseucci | 365/185.21 |
| 5,594,691 | 1/1997 | Bashir | 365/189.09 |
| 5,654,918 | 8/1997 | Hammick | 365/185.2 |

FOREIGN PATENT DOCUMENTS 0 678 874 A1  10/1995  European Pat. Off. .

OTHER PUBLICATIONS

Sweha et al., "A 29ns 8MB EPROM with Dual Reference–Column ATD Sensing," in IEEE International Solid–State Circuits Conference, Digest of Technical Papers, New York, New York, Feb. 1991, pp. 264–265, 327.

*Primary Examiner*—David Nelms
*Assistant Examiner*—Son Mai
*Attorney, Agent, or Firm*—David V. Carlson; Seed and Berry LLP

[57] ABSTRACT

The read circuit presents a current mirror circuit including a first and second load transistor interposed between the supply line and a respective first and second output node. The first output node is connected to a cell to be read, the second output node is connected to a generating stage generating a reference current having a predetermined characteristic, and the size of the second load transistor is N times greater than the first load transistor. To permit rapid cell reading even in the presence of low supply voltage and with no initial uncertainty, an equalizing circuit presents a current balancing branch connected between the first output node and ground for generating an equalizing current presenting a ratio of 1/N with the reference current to balance the circuit before commencing the reading.

29 Claims, 6 Drawing Sheets

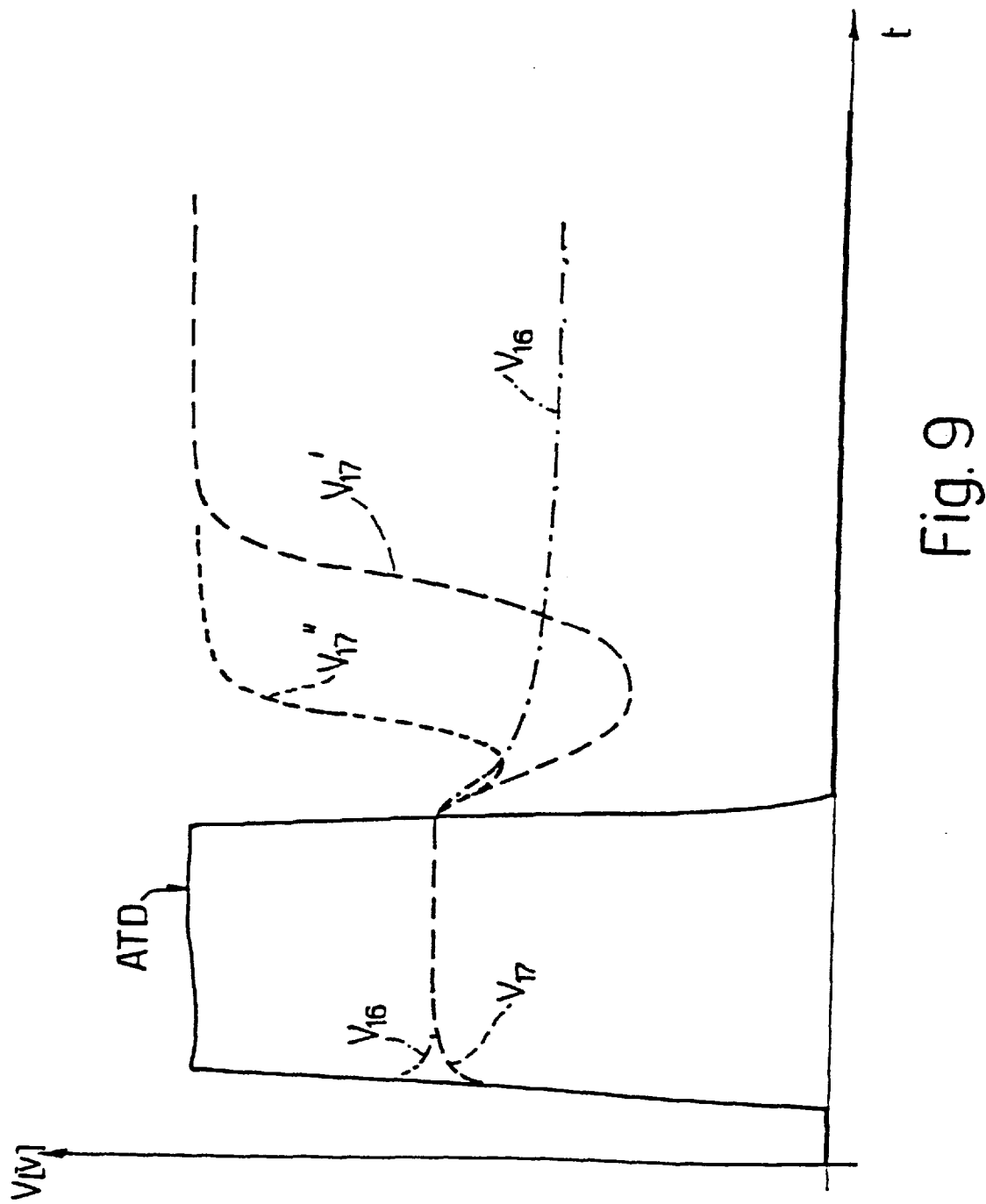

5,886,925

READ CIRCUIT AND METHOD FOR NONVOLATILE MEMORY CELLS WITH AN EQUALIZING STRUCTURE

TECHNICAL FIELD

The present invention relates to a read method and circuit for nonvolatile memory cells with an equalizing structure.

BACKGROUND OF THE INVENTION

As is known, to read the cells of nonvolatile, particularly flash, memories, the row and column to which the cell to be read is connected are appropriately biased and the current flow through the cell is detected. If the cell is written, its threshold voltage is higher than the read voltage and the cell conducts no current. If the cell is erased, its threshold voltage is lower than the read voltage, and the cell conducts current. Written and erased cells are discriminated by comparing the current flow in the cell with a reference current generated by a reference cell. The comparison is made by a read circuit comprising a current/voltage converter for converting the current of the cell to be read and the reference cell into corresponding voltages, and comprising a sense amplifier for comparing the two voltages and generating a logic output signal, the state of which depends on the outcome of the comparison.

To ensure correct read operation and reliable cycling (multiple cycle operation) of the memory array, certain limits must be posed on the distribution of the threshold voltages of the cells. More specifically, currently used technologies require that the threshold voltage of the most erased cells be above zero, and the threshold voltage of the worst erased cells be about 2.5 V. The lower limit substantially arises from the need to ensure against read errors caused by depleted cells (cells with a threshold voltage below zero), while the upper limit is due to the intrinsic distribution of the cell threshold voltages according to the fabrication technology used.

Since the read voltage normally coincides with the supply voltage, read problems arise in the case of a low supply voltage (about 2.5 V), due to the poorly erased cells, which conduct a very low current, being considered written and so resulting in read errors.

In view of the current demand for memories capable of operating within a wide range in relation to the supply voltage (typically, with supply voltages of 2.5 to 4 V) and with fast access times (<100 ns), a sense amplifier is required, which is capable of fast, correct reading within the fall range of supply voltages involved.

To solve the problem of achieving a reasonable read time of poorly erased cells, a co-pending patent application, entitled "Method and circuit for reading low-supply-voltage memory array cells" (Attorney Docket No. 854063.453), filed Jun. 18, 1997, relates to a solution in which the current/voltage converter operates in the opposite way as compared with standard converters, to enable even poorly erased array cells to be read rapidly in the presence of low supply voltage (when the memory cells conduct a low current).

For the written cells to be determined correctly, however, the above solution poses limits as regards the maximum permissible supply voltage.

To give a clearer idea of the problem, FIGS. 1 and 2 show the solution proposed in the above co-pending patent application.

In FIG. 1, the read circuit is indicated by 1, and comprises an array branch 2 and a reference branch 3. Array branch 2 comprises an array cell 4 to be read, forming part of a memory array 5 and connected to an array bit line 6 and reference branch 3 comprises a reference cell 7 connected to a reference bit line 8. Array bit line 6 (together with other array bit lines not shown and forming part of memory array 5) and reference bit line 8 are connected to a current/voltage converter 9 via a conventional decoding, biasing and equalizing circuit 10 not essential to the description and therefore not shown in detail. Circuit 10 provides for selecting the array bit line 6 of the cell 4 to be read, appropriately biasing it (and reference bit line 8) to prevent spurious read phenomena such as soft writing, and possibly also equalizing lines 6 and 8 before the cell is actually read.

Converter 9 comprises an array load 12 and reference load 13 forming a current mirror circuit and connected to array and reference bit lines 6 and 8 via circuit 10. More specifically, and according to the teachings of the above co-pending patent application, array load 12 comprises a diode-connected PMOS transistor, and reference load 13 a PMOS transistor. Array load transistor 12 has the source terminal connected to a supply line 15 at $V_{CC}$, the drain terminal connected to circuit 10 at a node 16, the gate terminal connected to the gate terminal of reference load transistor 13, and a width/length ratio W/L=K. And reference load transistor 13 has the source terminal connected to supply line 15, the drain terminal connected to circuit 10 at a node 17, and a width/length ratio W/L=N*K, where N is a multiplication constant.

Nodes 16, 17 are connected to the inputs of sense amplifier 18.

In the FIG. 1 circuit, since the diode (low-impedance) element is connected to array bit line 6 instead of to reference bit line 8, and in view of the width/length ratio of transistors 12 and 13, the current in I/V converter 9 is imposed by memory cell 4, and is supplied, amplified by N, to reference branch 3 where it is compared with the current flowing in reference cell 7. This therefore provides for rapidly reading the array cell, even when it is poorly erased and conducts only a small amount of current due to the low supply voltage.

FIG. 2 shows the current/voltage characteristics obtainable from the FIG. 1 circuit by biasing the drain terminal of the cells (both array and reference cells) at about 1 V (linear operating region) and assuming a boost voltage $V_B$ is used to increase the voltage $V_{GS}$ between the gate and source terminals of cell 4 with respect to supply voltage $V_{CC}$.

In FIG. 2, $I_R$ indicates the I/V characteristic of the reference cell with a fixed, known threshold voltage $V_{TR}$. $I_{TC}$ indicates the characteristic of the worst erased array cell with the maximum permissible threshold voltage $V_{TC}$ (2.5 V with the above specifications); $I_{TCN}$ indicates characteristic $I_{TC}$ amplified by the FIG. 1 configuration. $I_{TCNB}$ indicates characteristic $I_{TCN}$ in the presence of bootstrap voltage $V_B$—by which it is shifted by $V_B$ towards the origin—and therefore presenting a threshold voltage of ($V_{TC}$–$V_B$). $I_{TW}$ indicates the characteristic of the worst written array cell with the minimum permissible threshold voltage $V_{TW}$. $I_{TWN}$ indicates characteristic $I_{TW}$ amplified by the FIG. 1 configuration. And $I_{TWNB}$ indicates characteristic $I_{TWN}$ in the presence of bootstrap voltage and with a threshold voltage of ($V_{TW}$–$V_B$).

As shown clearly in FIG. 2, the intersection of characteristics $I_R$ and $I_{TCNB}$ determines the minimum supply voltage $V_1$, and that of characteristics $I_R$ and $I_{TWNB}$ the maximum supply voltage $V_2$, i.e., the voltages below and above which reading (recognition of erased and written cells respectively) is not possible.

Voltages $V_1$ and $V_2$ may be determined analytically, bearing in mind that:

$$I_R = G^*(V - V_{TR}) \quad (1)$$

$$I_{TC} = G^*(V - V_{TC})$$

$$I_{TCN} = N^* I_{TC} = N^* G^*(V - V_{TC})$$

$$I_{TW} = G^*(V - V_{TW})$$

$$I_{TWN} = N^* I_{TW} = N^* G^*(V - V_{TW})$$

$$I_{TCNB} = N^* G^*(V - V_{TC} + V_B) \quad (2)$$

$$I_{TWNB} = N^* G^*(V - V_{TW} + V_B) \quad (3)$$

where G is the slope of the nonamplified characteristics.

By equaling relation (1) to (2) and relation (1) to (3), the following voltages are obtained:

$$V_1 = (N^* V_{TC} - N^* V_B - V_{TR})/(N-1)$$

$$V_2 = (N^* V_{TW} - N^* V_B - V_{TR})/(N-1)$$

For example, if $V_{TC}$=2.5 V, $V_{TW}$=4.5 V, $V_{TR}$=1.25 V, $V_B$=0.8 V and N=8, then $V_1$=1.76 V and $V_2$=4 V.

As such, though the above solution provides for reading memory cells even when the minimum supply voltage is low, the maximum permissible supply voltage is also low.

For also reading memory cells with a high maximum supply voltage, but without at the same time increasing the minimum supply voltage, according to a further co-pending patent application entitled "Method and circuit for generating a read reference signal for nonvolatile memory cells" (Attorney Docket No. 854063.455), filed Jun. 18, 1997 and incorporated herein by way of reference, the reference characteristic comprises two segments with different slopes.

In read circuits of the type considered, to speed up reading in the presence of a low supply voltage, an equalizing network is used to connect nodes 16 and 17 and bring them to the same voltage before they are read. Since it depends, however, on various parameters, and in view of the unbalanced loads involved, the actual voltage level reached by nodes 16 and 17 cannot be established accurately beforehand, and, in the event of an unbalanced voltage level, reading may be commenced erroneously before eventually reaching the correct value, thus resulting in such a time loss as to at least partly reduce the theoretic advantage of the equalizing function.

SUMMARY OF THE INVENTION

It is an object of the present invention to provide a method and an equalizing circuit designed to solve the above problem and permit rapid reading even at a low supply voltage.

According to the present invention, there is provided a circuit for reading data stored in a nonvolatile memory cell having control and output terminals and having a memory threshold that is programmed at either a first or second voltage, the first voltage causing the cell to store a first data value and the second voltage causing the cell to store a second data value, the second voltage greater than the first voltage. The circuit includes a read terminal coupled to the control terminal of the memory cell and also coupled to receive a read voltage. An amplifier has a first terminal coupled to the output terminal of the memory cell and also has a second input terminal and an output terminal that provides the stored value. A reference cell has a control terminal coupled to the read terminal and an output terminal coupled to the second input terminal of the amplifier. The reference cell also has a reference threshold that is less than the read voltage. A current mirror has a current input terminal coupled to the output terminal of the memory cell, and has a current output terminal coupled to the output terminal of the reference cell. An equilibrate circuit is coupled to the current input and output terminals of the current mirror.

BRIEF DESCRIPTION OF THE DRAWINGS

A preferred, non-limiting embodiment of the present invention will be described by way of example with reference to the accompanying drawings, in which:

FIG. 9 shows a graph of a number of electric quantities in the FIG. 7 and 8 diagrams.

DETAILED DESCRIPTION OF THE INVENTION

Figure 2:
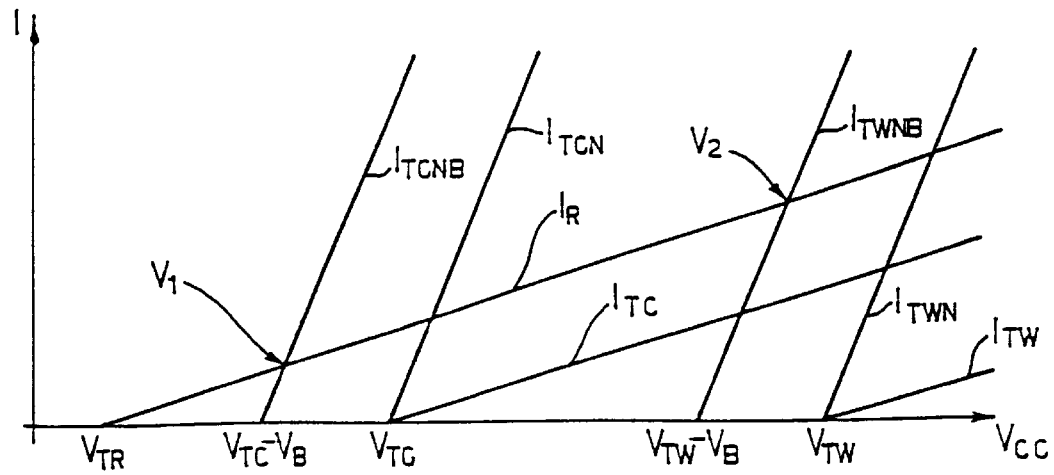
FIG. 2 shows the characteristics obtainable from the FIG. 1 circuit.
Figure 3:
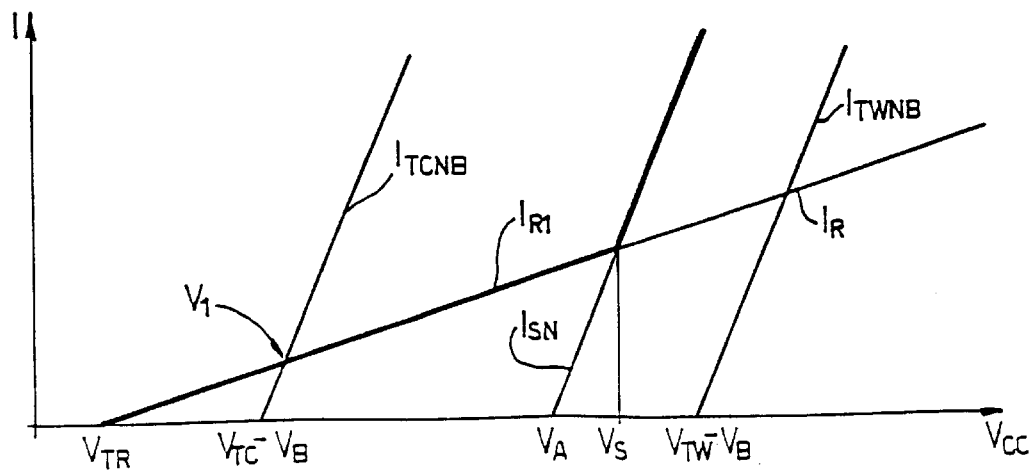
FIG. 3 shows the characteristics obtainable from the method according to the present invention.

In FIG. 3, characteristics $I_{TCNB}$, $I_{TWNB}$, $I_R$ and threshold voltages $V_{TR}$, $(V_{TC}-V_B)$, $(V_{TW}-V_B)$ have the same meaning as in FIG. 2, whereas the reference characteristic is indicated $I_{R1}$. As can be seen, the reference characteristic, generated by the reference branch of the array, comprises two segments: a first segment coinciding with the first portion of characteristic $I_R$ in FIG. 2 up to a trigger voltage $V_S$, and a second segment coinciding with a characteristic $I_{SN}$ presenting a threshold voltage $V_A$ between $(V_{TC}-V_B)$ and $(V_{TW}-V_B)$ and a slope $N^*G$.

The fact that the first part of characteristic $I_{R1}$ coincides with $I_R$ permits the same minimum value $V_1$ of supply voltage $V_{CC}$ to be maintained, while at the same time ensuring a high current difference between the array and reference branches and enhancing dynamic performance.

The second segment with a steeper slope parallel to that of the amplified array characteristic, on the other hand, provides for eliminating the maximum limit posed on the supply voltage.

In selecting value $V_S$ marking the change in the slope of characteristic $I_{R1}$, a trade-off must be made between the minimum permissible threshold value for the written cells and the current value required at low supply voltage to conform with the specified access time (since a low supply voltage corresponds with a low current value and hence slow charging and discharging of capacitive nodes). With the threshold voltages indicated above, for example, a $V_S$ value of 3 V may be selected.

Figure 4A:
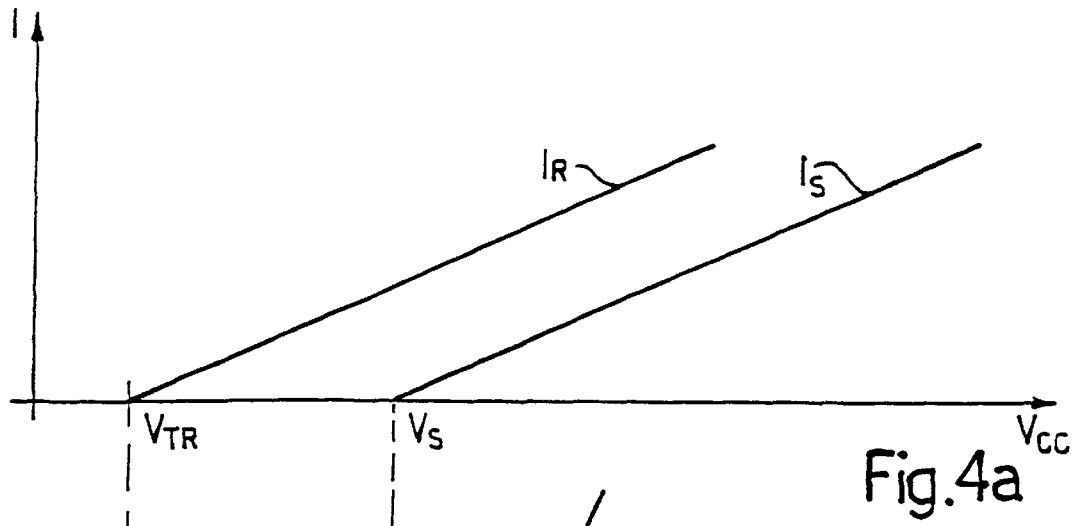
FIGS. 4a, 4b and 4c show how to obtain the reference characteristic in FIG. 3.
Figure 4B:
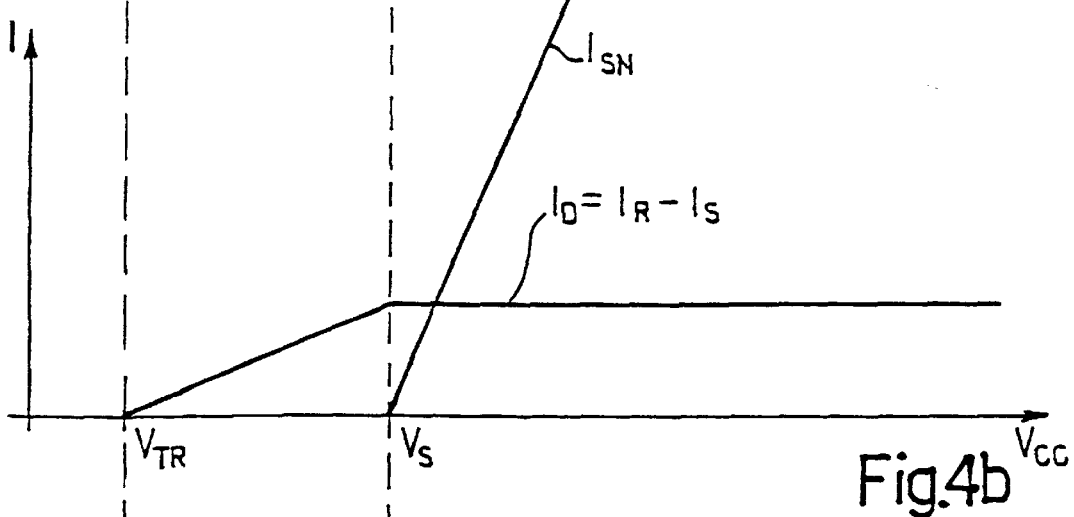
Figure 4C:
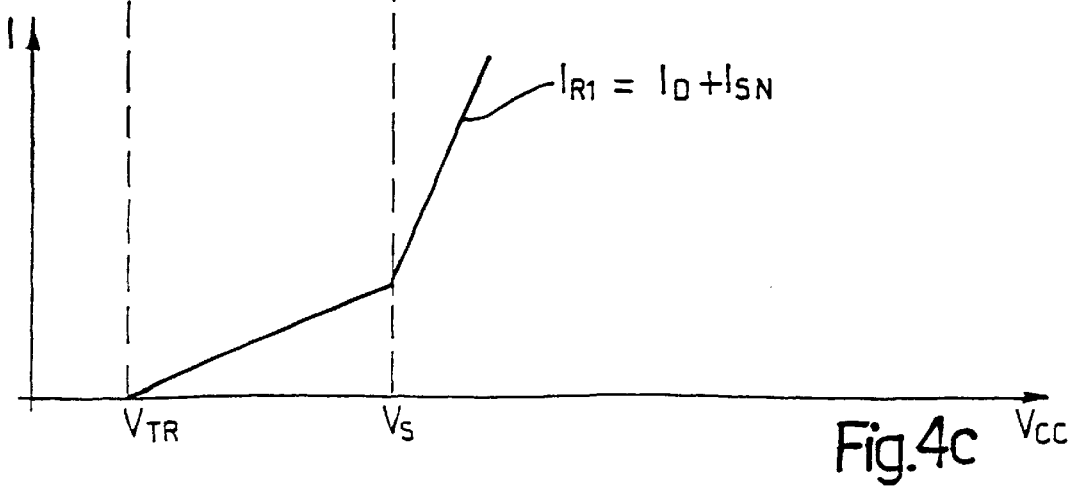

Characteristic $I_{R1}$ may be obtained as shown in FIGS. 4a, 4b and 4c from characteristic $I_R$ with threshold voltage $V_{TR}$ and from characteristic $I_S$ with threshold voltage $V_S$ and the same slope as characteristic $I_R$. And characteristic $I_S$ may be obtained either by appropriately regulating the threshold voltage of a special reference cell appropriately located in the memory device (outside array 5), or by adding two thresholds as explained in detail later on.

To obtain characteristic $I_{R1}$, first of all a difference characteristic $I_D=I_R-I_S$ equal to the difference between characteristics $I_S$ and $I_R$ is obtained. A characteristic $I_{SN}$ (FIG. 4b) is obtained by amplifying characteristic $I_S$ with a current mirror similar to that forming I/V converter 9, and, finally, characteristics $I_D$ and $I_{SN}$ are added to give characteristic $I_{R1}$ as shown in FIG. 4c.

Figure 5:
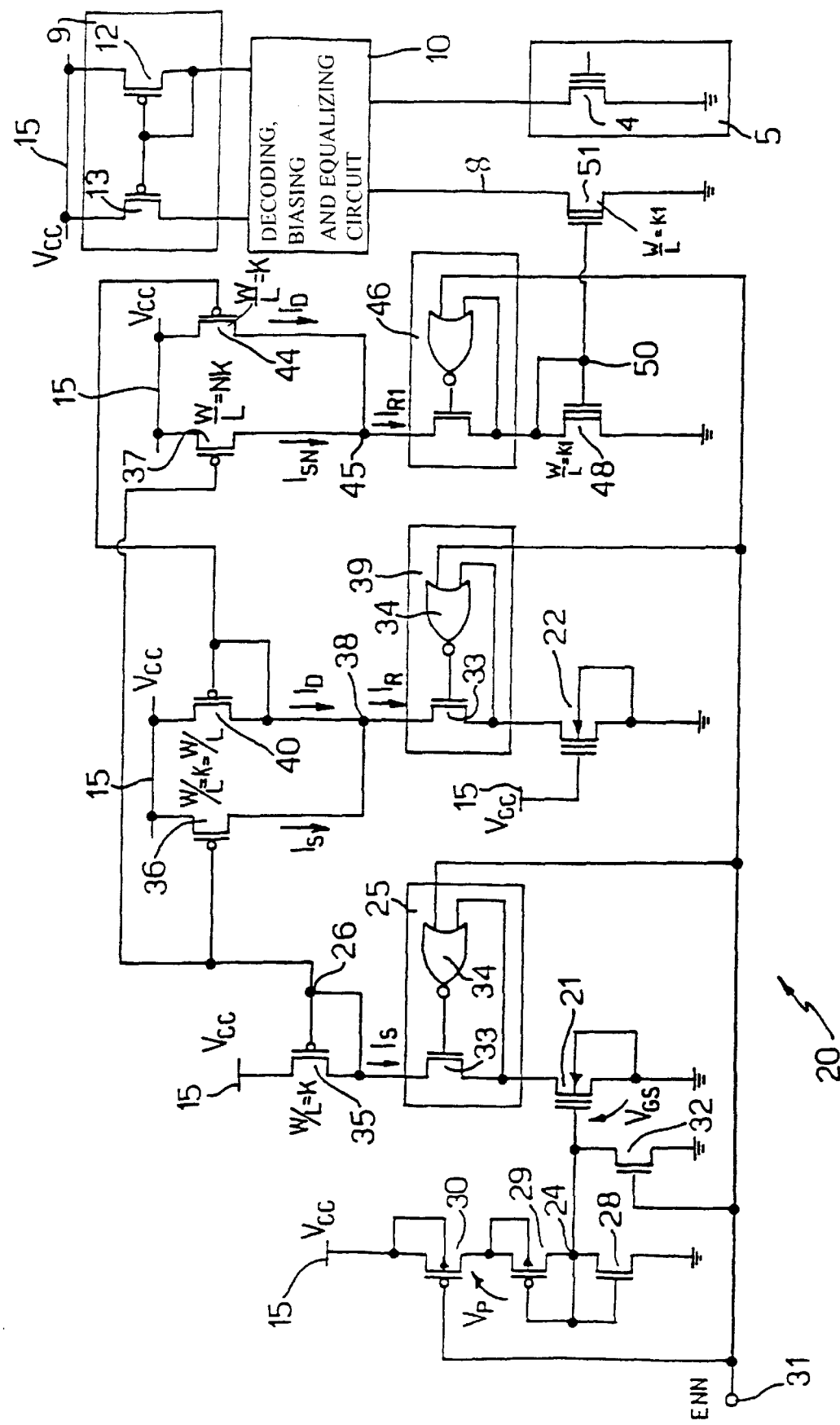
FIG. 5 shows an electric diagram of the circuit for generating the reference characteristic in FIG. 3.

A generating circuit capable of generating the above characteristic $I_{R1}$ is shown in FIG. 5 and described below.

The generating circuit, indicated by 20 in FIG. 5, comprises two floating-gate type (e.g., flash) memory cells 21, 22, both with threshold voltage $V_{TR}$. More specifically, cell 21 has the source terminal and bulk region grounded, the gate terminal connected to a node 24, and the drain terminal connected to a node 26 via a protection circuit 25 (to prevent phenomena such as soft writing). Node 24 is grounded via a diode-connected NMOS transistor 28 (drain and gate terminals shorted and connected to node 24) and is connected to supply line 15 via two PMOS transistors 29, 30. Transistor 29 is also diode-connected (drain and gate terminals shorted and connected to node 24). Transistor 30 has the source terminal and bulk region connected to supply line 15, and the gate terminal connected to an input 31 supplied with an active-when-low inverted enabling signal ENN. And an NMOS transistor 32 has the drain terminal connected to node 24, the source terminal grounded, and the gate terminal connected to input 31 to ground node 24 in standby mode and so avoid consumption.

Protection circuit 25 comprises an NMOS transistor 33 interposed between the drain terminal of cell 21 and node 26, and a NOR gate 34 having a first input connected to the drain terminal of cell 21, a second input connected to input 31, and the output connected to the gate terminal of transistor 33, so that, when signal ENN is low, NOR gate 34 controls the power-on level of transistor 33 in known manner, and (by means of a negative feedback) maintains the drain terminal of cell 21 at the desired biasing voltage (typically 1 V). Conversely, when high, signal ENN forces the output of NOR gate 34 to switch to low, thus turning off transistor 33 and cutting off the connection between node 26 and cell 21.

A diode-connected PMOS load transistor 35 has the source terminal connected to supply line 15, the gate and drain terminals connected to node 26, and a width/length ratio W/L=K, and is so connected as to form a current mirror with a PMOS load transistor 36 and with a PMOS transistor 37. Transistor 36 has the source terminal connected to supply line 15, the gate terminal connected to node 26, the drain terminal connected to a node 38, and a width/length ratio W/L=K equal to that of load transistor 35. And, via a protection circuit 39 identical to circuit 25 and therefore not described in detail, node 38 is connected to the drain terminal of cell 22, which has the gate terminal connected to supply line 15, and the source terminal and bulk region grounded.

Node 38 is also connected to the drain terminal of a diode-connected PMOS transistor 40, which has the gate terminal also connected to node 38, the source terminal connected to supply line 15, a width/length ratio W/L=K equal to that of load transistors 35 and 36, and forms a current mirror circuit with a PMOS transistor 44 also presenting a width/length ratio W/L=K.

Transistors 37 and 44, the gate terminals of which are connected respectively to nodes 26 and 38, have the source terminals connected to supply line 15, and the drain terminals connected to a node 45. Transistor 37 presents a width/length ratio W/L=N*K N times greater than that of transistor 35 with which it is connected to form a current mirror. Transistor 44 presents a width/length ratio W/L 32 K equal to that of transistor 40 with which it is connected to form a current mirror. And, via a protection circuit 46 identical to circuit 25 and therefore not described in detail, node 45 is connected to the drain terminal of a diode-connected native NMOS transistor 48 (i.e., with a low threshold voltage unaltered during fabrication). More specifically, native transistor 48 has the source terminal grounded, and the gate terminal forming a node 50 and connected to the drain terminal.

Transistor 48 forms a 1:1 current mirror circuit with one or more native NMOS transistors (one indicated by 51 in FIG. 5) connected to reference bit lines 8 of the various read circuits of the memory, and K1 in FIG. 5 indicates the width/length ratio of transistors 48 and 51, which is identical for both. For a clearer understanding of the connection of generating circuit 20 to read circuit 1, FIG. 5 also shows current/voltage converter 9, decoding, biasing and equalizing circuit 10, and memory cell 4 of FIG. 1.

The FIG. 5 circuit operates as follows.

When signal ENN is low (circuit 20 enabled), transistor 30 is turned on and connects diode-connected transistor 29 to supply line 15; transistor 32 is turned off; and the outputs of the NOR gates of protection circuits 25, 39 and 44 are not forced to zero, so that the voltage at node 24 is somewhere between supply voltage $V_{CC}$ and ground, depending on the sizing of diode-connected transistors 28, 29. More specifically, if $V_P$ is the threshold voltage of diode-connected transistor 29, equal to the minimum source-gate voltage drop for transistor 29 to be turned on, and by so sizing transistors 28, 29 that transistor 28 is much more resistive than transistor 29 and, hence, the difference between supply voltage $V_{CC}$ and threshold voltage $V_P$ of transistor 29 falls entirely on diode-connected transistor 28, then cell 21 has a gate-source voltage drop $V_{GS}$ of $V_{CC}-V_P$. In which case, and bearing in mind that cell 21 presents a threshold voltage of $V_{TR}$, cell 21 remains off as long as supply voltage $V_{CC}$ is less than the sum of threshold voltage $V_{TR}$ of cell 21 and voltage drop $V_P$. Above this supply voltage value, cell 21 starts conducting current, controlled by voltage $V_{GS}$, and therefore functions as a cell with a threshold voltage $V_S$ of $V_{TR}+V_P$.

From the above, it is clear that the current controlled by cell 21 and flowing in load transistor 35 equals current $I_S$ in FIG. 4a. Since transistor 36 forms a 1:1 mirror with transistor 35, the current flowing through transistor 36 is equal to $I_S$. The current in transistor 37 equals $N*I_S$, due to the width/length ratio of transistor 37 being N times greater than that of load transistor 35, and therefore corresponds to current $I_{SN}$ in FIG. 4b. Due to the gate terminal of cell 22 being connected directly to the supply line, the current flowing in cell 22 equals $I_R$, so that the current flowing in transistor 40, equal to the difference between current $I_R$ imposed by cell 22 and current $I_S$ supplied by transistor 36, equals current $I_D$ in FIG. 4b. Current $I_D$ is mirrored by transistor 44 and supplied to node 45 together with current $I_{SN}$ supplied by transistor 37 and native transistor 48 therefore receives and transfers current $I_{R1}$ in FIG. 4c to reference bit line 8 via transistor(s) 51.

Current $I_{R1}$ so generated may therefore be transferred easily to the rest of the memory device using only one reference circuit 20 for all the device outputs.

Figure 6:
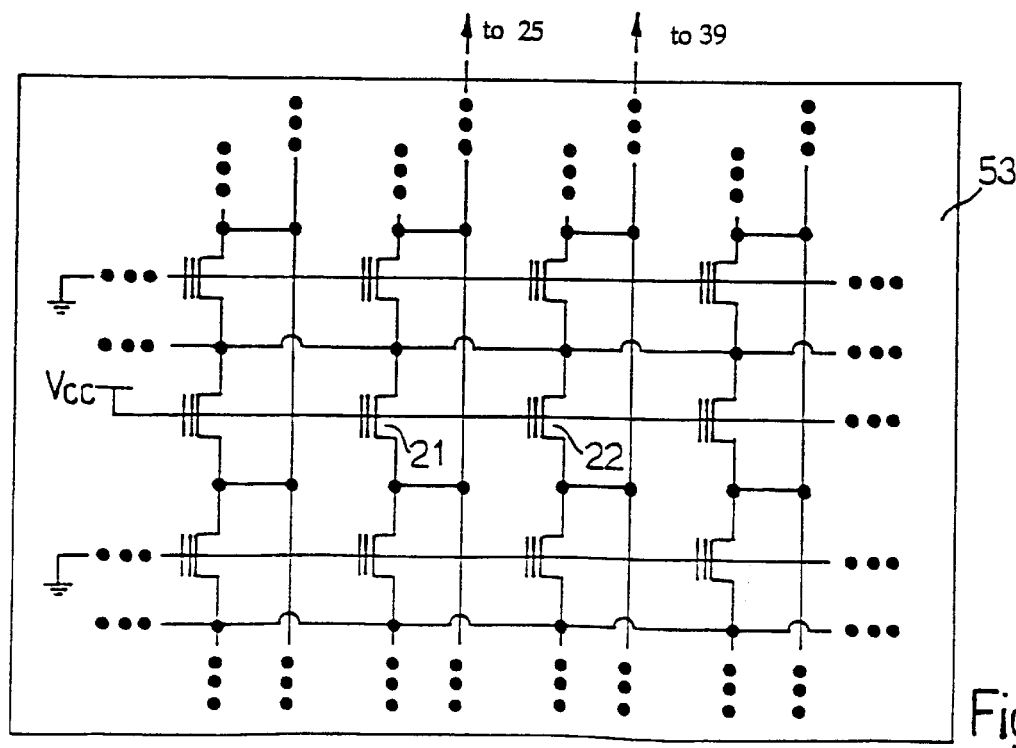
FIG. 6 shows an equivalent diagram of a variation of a detail in FIG. 5.

As an alternative to the FIG. 5 arrangement, memory cells 21 and 22 may be located outside memory array 5. More specifically, in the FIG. 6 example, a small, e.g., 8×8, cell array 53 is formed, and cells 21, 22 are selected from among the innermost cells to reduce the edge effects, and may therefore be written or erased in known manner during final EWS (Electrical Wafer Sort) testing of the device.

Being able to adjust the threshold voltage of cells 21, 22 in an independent way to the most appropriate value, the gate terminal of cell 21 may be connected directly to the supply line like cell 22, thus eliminating transistors 28–30 and directly setting the threshold voltage of cell 21 to the desired $V_S$ value. The advantage of this solution lies in the threshold voltage of characteristic $I_S$ (which, as is known, varies with temperature) depending solely on the variations of one component (cell 21 itself) instead of those of two components (cell 21 and transistor 29 in the FIG. 5 embodiment), so that the temperature performance of current $I_S$ is substantially the same as that of the other quantities generated by the other components of the device (cell 22 included). Moreover, the above solution also provides for using only two reference cells for the whole memory device.

Figure 1:
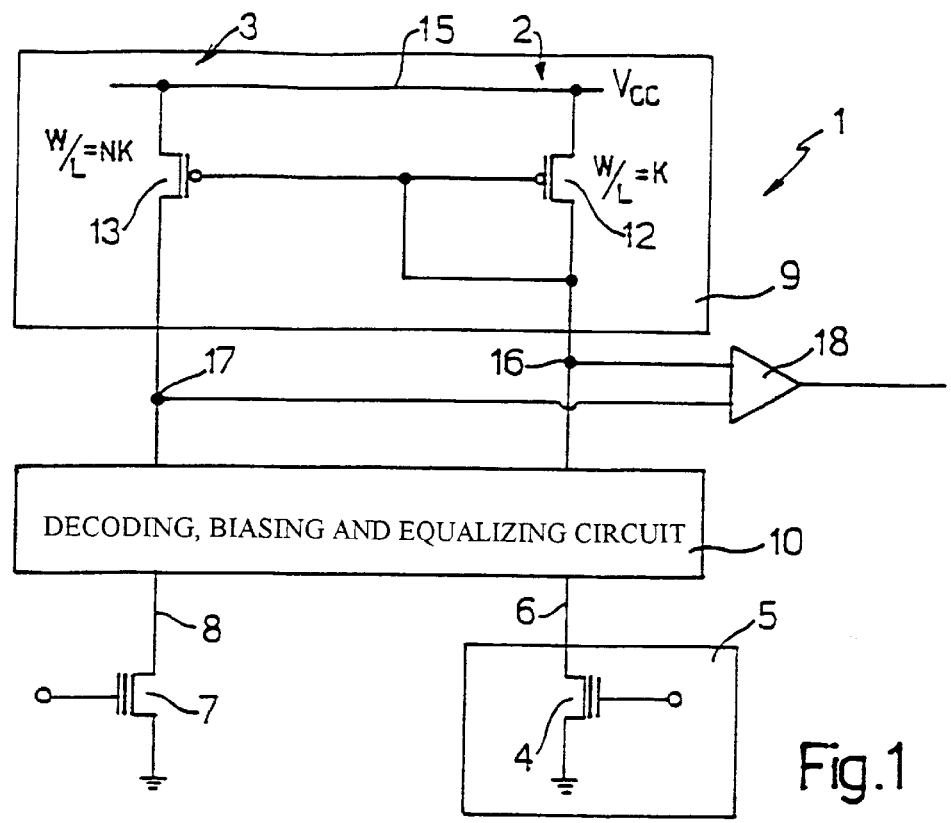
FIG. 1 shows an electric diagram of a read circuit as described in the aforementioned co-pending patent application.

Circuit 20 therefore permits read circuit 1 in FIG. 1 to be operated at both low and high supply voltage $V_{CC}$ (the maximum supply voltage is theoretically infinite) without penalizing either limit. Moreover, it is simple, reliable, and presents zero consumption in standby mode.

When read circuit 1 operates at low supply voltage, current flow in the circuit is low, but, on the other hand, the time taken to charge and discharge the capacitive nodes is increased, thus slowing down the read operation. One known solution to speed up reading of the cell is to use an equalizing network to connect nodes 16 and 17 and bring them to the same voltage at the ATD (Address Transition Detection) step, in which the addresses of the memory cells switch (high ATD pulse signal) before they are read.

Figure 7:
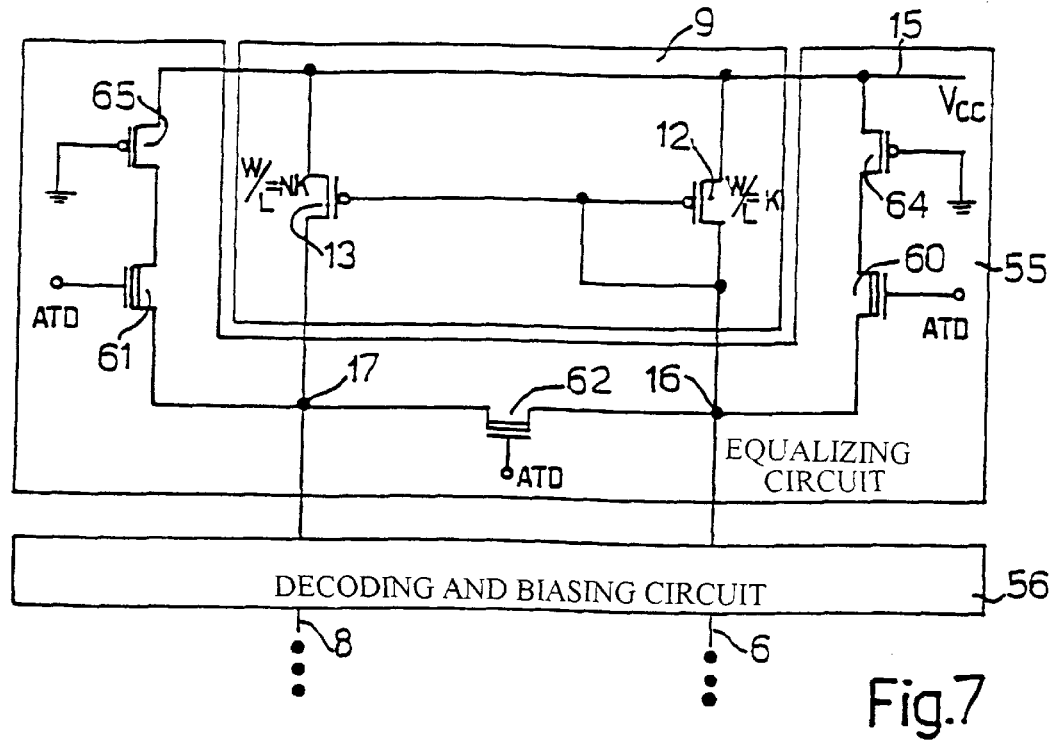
FIG. 7 shows an electric diagram of an equalizing circuit as applied to the FIG. 1 circuit.

More specifically, in FIG. 7, circuit 10 in FIG. 1 is shown divided into a known equalizing circuit 55 and a known decoding and biasing circuit 56 (not shown in detail). Equalizing circuit 55 substantially comprises a pair of transistors 60, 61 connected between supply line 15 and respective nodes 16, 17, and a connecting transistor 62 connected between nodes 16 and 17. More specifically, transistors 60–62 are native (low-threshold) NMOS transistors, PMOS protection transistors 64 and 65 are located between supply line 15 and respective transistors 60 and 61, and both transistors 64, 65 have the gate terminals grounded so that they are always turned on, and provide for protecting respective native transistors 60, 61 from voltage peaks on supply line 15.

The gate terminals of transistors 60, 61, 62 are all supplied with signal ATD so that, in the time interval in which signal ATD is high, they are turned on and bring nodes 16 and 17 to a voltage substantially equal to the high voltage of signal ATD (e.g., 3 V) less a threshold voltage (voltage drop $V_{GS}$ between the gate and source terminals). At the end of the ATD pulse, therefore, nodes 16 and 17 are at the same voltage, so that they are brought more rapidly to the voltage compatible with the erased or written state of the array cell to be read.

The actual (equalizing) voltage reached by nodes 16 and 17 at the equalizing step, however, depends on various parameters, such as temperature and current flow in the two branches, and, there being no possibility of establishing it accurately beforehand, may be too low or too high, thus impairing the effect of the equalizing function on read time.

If the equalizing voltage is too high (high voltage at nodes 16, 17), erased cell reading is slow. More specifically, with too high an equalizing voltage, load transistors 12, 13 forming I/V converter 9 may be turned off (insufficient source-gate voltage drop), so that, when equalizing transistors 60–62 are turned off at the end of the equalizing step, there is no current flow in load transistor 13 (which is still turned off), whereas reference cell 7 is turned on and drawing current. As such, nodes 16 and 17 function as if the array cell 4 to be read were written, even when in actual fact it is erased, so that, when reading an erased cell, the sense amplifier first supplies a wrong reading, which, though later corrected when converter 9 is turned on, results in a certain loss of time and hence an increase in read time.

Conversely, if the set equalizing voltage is too low, nodes 16 and 17 are brought to too low a voltage, so that written cell reading is slow. That is, the control voltage (source-gate voltage drop) of load transistors 12, 13 is so high as to bring nodes 16 and 17 to a voltage corresponding to an erased cell 4, even when in actual fact it is written. In the case of a written memory cell 4, a wrong initial setting of this sort is further compounded initially by the parasitic capacitances associated with bit line 6 (which must rise from the previous excessively low voltage to the correct level) absorbing current, which, albeit small, is amplified by converter 9 and interpreted at node 17 as being due to an erased cell. In the case of a written cell and too low an equalizing voltage, before the circuit reaches the correct condition, the above two effects combined cause the sense amplifier to supply a reading corresponding to an erased cell 4 and which, though corrected later, also means the correct reading is only obtained some time after the end of the ATD pulse.

For solving this problem, provision is made for an adaptive equalizing network for automatically setting the equalizing voltage of nodes 16 and 17 at an intermediate point corresponding to a balanced condition of the array and reference branches, i.e., the current required by reference bit line 8 equals the current supplied by I/V converter 9. The above condition is balanced in the sense that it is exactly halfway between the written cell read condition (current demand by reference branch 3 greater than that—ideally zero—supplied by array branch 2 via load 13) and the erased cell read condition (current supply by load 13 greater than the current demand of reference branch 3), so that the circuit is in an excellent condition to be unbalanced one way or the other at the end of the ATD pulse, depending on the state of array cell 4.

Figure 8:
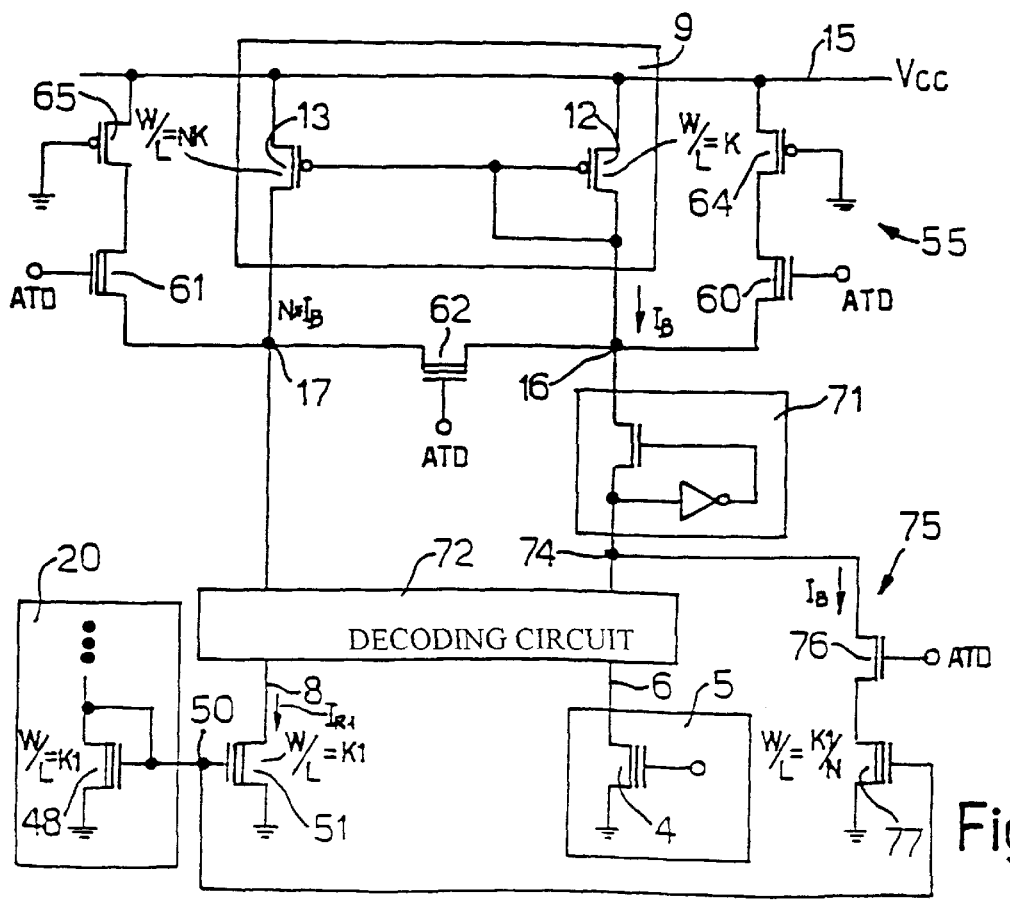
FIG. 8 shows an electric diagram of a new equalizing circuit.

To achieve the above-balanced condition, despite the unbalance due to the difference in the sizing of load transistors 12 and 13, provision is made, as shown in FIG. 8, for a grounding current path connected to the array branch, which is active at the equalizing step and provides for the same but opposite current unbalance as that produced by I/V converter 9. More specifically, in FIG. 8, circuit 10 in FIG. 1 is shown divided into its three components: known equalizing circuit 55, biasing circuit 71 (similar to circuits 25, 39, 46 in FIG. 5) for preventing soft writing, and decoding circuit 72. A node 74 is provided between biasing circuit 71 and decoding circuit 72, a balancing branch 75 is provided between node 74 and ground to define a grounding path, and comprises an NMOS selection transistor 76 and a native NMOS balancing transistor 77. Selection transistor 76 has the drain terminal connected to node 74, the gate terminal supplied with signal ATD, and the source terminal connected to the drain terminal of balancing transistor 77. And balancing transistor 77 has the source terminal grounded, and the gate terminal connected to node 50 of generating circuit 20 in FIG. 5. In practice, like transistor 51 connected to reference bit line 8, balancing transistor 77 is connected to form a current mirror with transistor 48 of circuit 20, but presents a width/length ratio N times smaller than transistor 51, i.e., equal to K1/N.

At the equalizing step, when signal ATD is high and equalizing network 55 is active, balancing branch 75 is therefore also active, and balancing transistor 77 draws a current $I_B$ that is N times smaller than current IR1 drawn by transistor 51. Current $I_B$, supplied by load transistor 12 of I/V converter 9, is mirrored, multiplied N times, by load transistor 13, so that it equals current $I_{R1}$ drawn by transistor 51. The read circuit is therefore balanced, with nodes 16 and 17 at a voltage halfway between those corresponding to a written and erased cell, so that the load transistors are neither turned on nor off excessively. Thus, when, at the end of the ATD pulse, transistors 60, 61, 62 and 76 are turned off (disabling equalizing network 55 and balancing branch 75), the read circuit is ready to detect the actual state of cell 4 to be read, with none of the delays due to spurious initial switching, as described above.

To show the read speed obtainable by virtue of balancing branch 75, FIG. 9 shows the difference in the voltage behavior at reference node 17 using the FIG. 7 and 8 circuits and relative to an erased array cell 4. In FIG. 9, $V_{16}$ indicates the voltage at node 16, $V_{17}$ the voltage at node 17 in both the FIG. 7 and 8 circuits, $V_{17}'$ the voltage at node 17 in the FIG. 7 circuit, and $V_{17}''$ the voltage at node 17 in the FIG. 8 circuit. As shown, in the presence of the ATD pulse, voltage $V_{17}$ equals $V_{16}$ in both circuits. At the end of the ATD pulse, on the other hand, voltage $V_{17}'$ in the FIG. 7 circuit falls for a given time below $V_{16}$, thus causing a wrong initial reading, and requires additional read time to reach the correct (high) value, whereas voltage $V_{17}''$ in the FIG. 8 circuit reaches the correct voltage much more quickly, thus supplying a correct reading immediately and so greatly reducing read time as compared with the FIG. 7 circuit.

As such, low-voltage dynamic performance of the read circuit is enhanced and comparable with that obtainable at high voltage and hence high current.

Clearly, changes may be made to the method and circuit as described and illustrated herein without, however, departing from the spirit and scope of the present invention. In particular, circuit 20 may differ from that described, and any of the elements may be replaced by technical equivalents. From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A circuit for reading data stored in a nonvolatile memory cell having control and output terminals and having a memory threshold that is programmed at either a first or second voltage, the first voltage causing the cell to store a first data value and the second voltage causing the cell to store a second data value, the second voltage greater than the first voltage, the control terminal of the memory cell being coupled to receive a read voltage, the circuit comprising:

an amplifier having a first terminal coupled to the output terminal of the memory cell, the amplifier also having a second input terminal and having an output terminal that provides the stored value;

a reference cell having a control terminal and having an output terminal coupled to the second input terminal of the amplifier;

a current mirror having a current input terminal coupled to the output terminal of the memory cell and having a current output terminal coupled to the output terminal of the reference cell; and a balance circuit coupled to the output terminal of the memory cell and to the control terminal of the reference cell.

2. The circuit of claim 1 wherein the reference cell has a threshold that is equal to or less than the first voltage.

3. The circuit of claim 1 wherein the read voltage is between the first and second voltages.

4. The circuit of claim 1 wherein the read voltage is greater than the second voltage.

5. The circuit of claim 1 wherein the reference cell comprises a nonvolatile reference cell that has a structure that is similar to that of the memory cell.

6. The circuit of claim 1 wherein the current mirror has a current gain that is greater than one.

7. The circuit of claim 1, further comprising:

a supply terminal;

the current mirror comprising:
  a first transistor coupled between the supply terminal and the current input terminal, the first transistor having a control terminal coupled to the current input terminal; and
  a second transistor coupled between the supply terminal and the current output terminal, the second transistor having a control terminal coupled to the current input terminal; and the equilibrate circuit comprising a third transistor coupled between the current input and output terminals of the current mirror, the third transistor having a control terminal coupled to receive an address-transition-detect signal.

8. The circuit of claim 1, further comprising:

first and second supply terminals;

wherein the reference cell has a reference voltage-to-current gain;

wherein the current mirror comprises:
  a first transistor coupled between the first supply terminal and the current input terminal, the first transistor having a control terminal coupled to the current input terminal and having a first voltage-to-current gain; and
  a second transistor coupled between the first supply terminal and the current output terminal, the second transistor having a control terminal coupled to the current input terminal and having a second voltage-to-current gain that is greater than the first voltage-to-current gain, a gain ratio being equal the quotient of the second voltage-to-current gain divided by the first voltage-to-current gain; and wherein the equilibrate circuit comprises:
  a third transistor coupled between the current input and output terminals of the current mirror, the third transistor having a control terminal coupled to receive an address-transition-detect signal; and
  a fourth transistor that is coupled between the current input terminal and the second supply terminal, the fourth transistor having a control terminal coupled to the read terminal and having a fourth voltage-to-current gain that is substantially equal to the reference voltage-to-current gain multiplied by the inverse of the gain ratio.

9. The circuit of claim 1, further comprising:

first and second supply terminals;

wherein the reference cell has a reference width-to-length ratio;

wherein the current mirror comprises:
- a first MOS transistor coupled between the first supply terminal and the current input terminal, the first transistor having a control terminal coupled to the current input terminal and having a first width-to-length ratio;
- a second MOS transistor coupled between the first supply terminal and the current output terminal, the second transistor having a control terminal coupled to the current input terminal and having a second width-to-length ratio that is greater than the first width-to-length ratio; and wherein the equilibrate circuit comprises:
- a third transistor coupled between the current input and output terminals of the current mirror, the third transistor having a control terminal coupled to receive an address-transition-detect signal; and
- a fourth transistor that is coupled between the current input terminal and the second supply terminal, the fourth transistor having a control terminal coupled to the read terminal and having a third width-to-length ratio, the ratio of the first to second width-to-length ratios being substantially equal to the ratio of the third to reference width-to-length ratios.

10. A circuit for reading a nonvolatile memory cell having an output terminal, the circuit comprising:

first and second supply terminals;

a read node coupled to the output terminal of the memory cell;

a reference node;

an amplifier having first and second input terminals respectively coupled to the read and reference nodes;

a first transistor coupled to the first supply terminal and the read node, the first transistor having a control terminal coupled to the read node;

a second transistor coupled to the first supply terminal and the reference node, the second transistor having a control terminal coupled to the read node;

a reference cell coupled to the second supply terminal and the reference node, the reference cell having a control terminal;

a switch coupled to the read and reference nodes, the switch having a control terminal; and a balance cell coupled to the second supply terminal and the read node, the balance cell having a control terminal coupled to the control terminal of the reference cell.

11. The circuit of claim 10, wherein:

the first transistor has a first width-to-length ratio;

the second transistor has a second width-to-length ratio that is N times the first width-to-length ratio, N being greater than one;

the balance cell comprises a third transistor that has a third width-to-length ratio; and the reference cell comprises a fourth transistor that has a fourth width-to-length ratio that is substantially N times the third width-to-length ratio.

12. The circuit of claim 10, further comprising a reference circuit that is coupled to the control terminals of the reference and balance cells.

13. A method, comprising:

coupling a read node to a reference node;

during the coupling, drawing a balance current from the read node, the balance current being proportional to an offset current being drawn from the reference node;

uncoupling the read node from the reference node;

after the uncoupling, driving a nonvolatile memory cell that is storing a data value with a read voltage such that the memory cell draws a read current from a read node, the read current equaling a first current value when the memory cell is storing a first data value and equaling a second current value when the memory cell is storing a second data value, the first current value being greater than the second current value;

driving a reference cell with the read voltage such that the reference cell draws a reference current from a reference node;

supplying to the reference node a drive current that is proportional to the read current by a proportion factor when the drive current is less than the reference current, the drive current having a maximum value substantially equal to the reference current; and comparing a read voltage at the read node with a reference voltage at the reference node to read the data value stored in the memory cell.

14. The method of claim 13, further comprising:

programming a threshold of the memory cell to a first threshold value to store the first data value in the memory cell; and programming the threshold of the memory cell to a second threshold value to store the second data value in the memory cell, the first threshold value being less than the second threshold value.

15. The method of claim 13 wherein the driving a reference cell comprises driving the reference cell such that the reference current is between the first and second current values.

16. The method of claim 13 wherein the first current value is substantially equal to zero.

17. The method of claim 13 wherein the drive current is greater than the read current when the drive current is less than the reference current.

18. The method of claim 13, further comprising:

programming a threshold voltage of the memory cell to a first threshold value to store the first data value in the memory cell;

programming the threshold voltage of the memory cell to a second threshold value to store the second data value in the memory cell, the first threshold value being less than the second threshold value; and generating the read voltage to be between the first and second threshold values.

19. The method of claim 13 wherein the coupling comprises closing a switch that is coupled between the read and reference nodes.

20. The method of claim 13 wherein the drawing a balance current comprises driving with a same signal level a balance transistor that is coupled to the read node and a reference transistor that is coupled to the reference node, the balance transistor having a gain that is proportional to a gain of the reference transistor by the proportion factor.

21. In a nonvolatile memory cell read circuit comprising a current mirror circuit in turn comprising a first and second load transistor interposed between a first reference potential line and a respective first and second output node, said first load transistor having a first dimensional parameter, said second load transistor having a second dimensional parameter, said second and first dimensional parameters defining a ratio of N where N is a predetermined number, said second output node being connected to a reference generating circuit generating a reference current having a predetermined characteristic, and said first output node being connected to at least one memory cell to be read; and an equalizing circuit connected to said first and second output nodes, an equalizing method comprising the step of temporarily biasing said first and second output nodes at an equal voltage value, characterized in that, during said temporary biasing step, an equalizing current is generated, flowing between said first output node and a second reference potential line; said equalizing current and said reference current presenting a ratio of 1/N.

22. A method as claimed in claim 21 wherein N is a number greater than one.

23. A nonvolatile memory cell read circuit comprising:

a first current mirror circuit comprising a first and second load transistor interposed between a first reference potential line and a respective first and second output node, said first load transistor having a first dimensional parameter, said second load transistor having a second dimensional parameter, said second and first dimensional parameters defining a ratio of N where N is a predetermined number;

said first output node being connected to at least one memory cell to be read, and said second output node being connected to a reference generating stage generating a reference current having a predetermined characteristic; and an equalizing circuit connected to said output nodes;

characterized in that said equalizing circuit comprises a current balancing branch connected between said first output node and a second reference potential line and generating an equalizing current; said equalizing current and said reference current presenting a ratio of 1/N.

24. A circuit as claimed in claim 23 wherein said reference generating stage presents a control node connected to control terminals of a first and second transistor element; said first transistor element being connected between said first output node and said second reference potential line; and said second transistor element being connected between said second output node and said second reference potential line.

25. A circuit as claimed in claim 24 wherein said first and second transistor elements comprise a native MOS transistor.

26. A circuit as claimed in claim 24, further comprising a controlled switching element interposed between said first transistor element and said first output node and having a control terminal receiving an equalization enabling signal.

27. A circuit as claimed in claim 24 wherein said reference generating stage comprises at least one reference memory cell generating a reference cell signal having a predetermined characteristic, and a connecting circuit comprising at least one second current mirror circuit having a first and second reference node connected respectively to said reference memory cell and to a third transistor element forming a fourth current mirror circuit with said first and second transistor elements.

28. A circuit as claimed in claim 24 wherein said first and second load transistors are MOS transistors of a first channel type; wherein said dimensional parameter comprises the channel width/length ratio; and wherein said first and second transistor elements each comprise a MOS transistor of a second channel type; said second transistor element having a dimensional ratio equal to a predetermined number K1; and said first transistor element presenting a dimensional ratio of K1/N.

29. A circuit as claimed in claim 28 wherein said first load transistor is diode-connected, and said number N is a number greater than one.

* * * * *

UNITED STATES PATENT AND TRADEMARK OFFICE
CERTIFICATE OF CORRECTION

PATENT NO. : 5,886,925
DATED : March 23, 1999
INVENTOR(S) : Giovanni Campardo et al.

It is certified that error appears in the above-identified patent and that said Letters Patent is hereby corrected as shown below:

On the cover page, please insert item
"[30]   Foreign Application Priority Data
June 18, 1996  [EP]  European Pat. Off. .......... 96830347.9"

Signed and Sealed this

Second Day of January, 2001

Attest:

Attesting Officer

Q. TODD DICKINSON

Commissioner of Patents and Trademarks

UNITED STATES PATENT AND TRADEMARK OFFICE
CERTIFICATE OF CORRECTION

PATENT : 5,886,925
DATED : March 23, 1999
INVENTOR(S) : Giovanni Campardo et al.

It is certified that error appears in the above-identified patent and that said Letters Patent is hereby corrected as shown below:

On the cover page, please insert item
"[30]    Foreign Application Priority Data
June 18, 1996 [EP] European Pat. Off. .......... 96830347.9"

Signed and Sealed this

Third Day of April, 2001

Attest:

NICHOLAS P. GODICI

Attesting Officer    Acting Director of the United States Patent and Trademark Office